United States Patent [19]
Ternes et al.

[11] Patent Number: 5,300,973
[45] Date of Patent: Apr. 5, 1994

[54] TRACK IMAGE REGISTRATION SYSTEM

[75] Inventors: James N. Ternes, Roseville; Daniel L. Cooke, Fridley; Willard J. Harder, Eden Prairie, all of Minn.

[73] Assignee: Ternes Register System, St. Paul, Minn.

[21] Appl. No.: 97,577

[22] Filed: Jul. 26, 1993

Related U.S. Application Data

[63] Continuation of Ser. No. 880,010, May 8, 1992, abandoned.

[51] Int. Cl.⁵ .................... G03B 27/20; G03B 27/60
[52] U.S. Cl. ........................................ 355/91; 355/92; 355/93; 355/94; 355/73
[58] Field of Search ............... 355/91, 92, 93, 94, 355/87, 88, 73, 76

[56] References Cited

U.S. PATENT DOCUMENTS

| | | | |
|---|---|---|---|
| 2,713,294 | 7/1955 | Padgett | 355/73 |
| 3,147,683 | 9/1964 | Hulen | 355/73 |
| 3,634,009 | 1/1972 | Van Dusen et al. | 355/73 |
| 3,771,870 | 11/1973 | Taylor | 355/91 |
| 4,159,176 | 6/1979 | deMasl | 355/79 |
| 4,284,349 | 8/1981 | Beasley et al. | 355/79 |
| 4,636,067 | 1/1987 | Richards | 355/91 |
| 4,664,511 | 5/1987 | Carlson et al. | 355/91 |
| 4,967,230 | 10/1990 | Meacham | 355/91 |
| 4,977,683 | 12/1990 | Harder | 355/73 |
| 5,023,659 | 6/1991 | Beasely | 355/88 |
| 5,072,257 | 12/1991 | Stoesser | 355/93 |

*Primary Examiner*—Monroe H. Hayes
*Attorney, Agent, or Firm*—Douglas L. Tschida

[57] ABSTRACT

A slide track, pin registration system for registering photosensitive media to light exposure equipment. The system includes one or more slide tracks and each of which contain media registration pins. The slide tracks are orthogonally mounted within grooves let into a resilient media support mat. Each pin is restrained in a spring biased retainer which retainer is loosely confined in a support base that slide mounts to the track. The number of pins and profile shapes are variable to match the media and registration requirements. In one vacuum system, the tracks are supported in a multi-chambered, foam backed bladder. In another the tracks are supported on a single chambered bladder. In still another system, the retainer slides within grooves formed in a rigid board.

17 Claims, 12 Drawing Sheets

TRACK IMAGE REGISTRATION SYSTEM

This is a continuation of application Ser. No. 07/880,010 filed May 8, 1992 now abandoned.

BACKGROUND OF THE INVENTION

The present invention relates to image registration systems for exposing photosensitive media, such as film, and, in particular, to a track mounted, spring biased registration pin system.

Imaging systems form a vital part of the printing industry and assure proper transfer of original master artwork to the printing plate, either directly or via an intermediate photosensitive media or film from which the printing plate is prepared. Critical to the process for multi-color printing is the necessity of maintaining the media in registration with the artwork through successive exposures to assure proper eventual alignment of the different color printings on the carrier media.

Three dimensional registration is required to assure the integrity of the exposed media. That is, the media and artwork must be longitudinally, laterally and vertically registered to a media support assembly. A common support assembly is known as a "vacuum frame". Vertical alignment can be achieved within the frame assembly with the use of various resilient pads, pressurized bladders or vacuum support assemblies, which maintain the media and artwork in flattened registration to a glass coverplate.

Longitudinal and lateral registration is commonly obtained with fixed height registration pins provided at the media support assembly. These pins may extend through holes in a resilient media support or may merely rest on the resilient support or an intermediate substrate. Such mountings can create difficulties in either mounting the media and artwork to the support or can produce a slight shifting or mis-registration of the media, due to the tipping of the pins during vacuum draw-down. Any mis-registration can become exaggerated over time with wear.

Various permanently mounted pin registration assemblies are disclosed in U.S. Pat. Nos. 4,636,067 and 4,967,230. The latter devices disclose media supports having individual bore holes through which individual registration pins extend. The pins of each of these assemblies rest on a relatively rigid backing piece which mounts below an overlying resilient layer.

A vacuum frame assembly is disclosed in U.S. Pat. No. 4,032,233 which provides grooved peripheral channels and along which a number of registration pins are moveably restrained. The pins are particularly coupled to a pinion containing, screw follower shaft which cooperates with pinions provided at each registration pin to simultaneously adjust each pin. The channelways surround the vacuum blanket, in contrast to being incorporated into the blanket. The pins thus restrain the periphery of the media and artwork, but which can induce a "cupping" and mis-register at the center region of the media during vacuum draw down.

The pins of each of the foregoing assemblies are also essentially permanently mounted. The pins cannot be independently replaced, re-positioned or varied in shape to mate with different hole configurations.

Support assemblies sold by the present assignee for use with vacuum frames of various manufacturers and which have proven effective are known under the brandname of IMAGE CONTROL BOARDS. These boards provide a resilient, yet rigid underlayment that contains a number of permanently mounted registration pins. The boards mount between a glass cover and vacuum blanket at the vacuum frame assembly.

Applicant, otherwise, believes it is preferable to register the media and artwork along a single edge and at a center portion of the media as opposed to the peripheral edges. The media and artwork are thereby able to flex and self adjust to the transparent cover as a vacuum is drawn. Ripples and other misalignment which can occur and/or tipping of the registration pins is thereby minimized.

With the foregoing in mind, applicant has developed an improved registration pin support assembly. The assembly is alternatively applied in one vacuum frame construction wherein an inflatable vacuum mat is formed to include slide adjusted registration pins. Another construction provides a channeled, non-inflatable mat which is constructed to permit use with existing vacuum frames.

SUMMARY OF THE INVENTION

It is accordingly a primary object of the present invention to provide improved means for registering light sensitive media and artwork to imaging or light exposure assemblies.

It is a further object of the invention to provide a resilient media including one or more registration pin containing slideways.

It is a further object of the invention to provide an improved vacuum frame assembly including one or more slide tracks which contain a plurality of removeable, selfaligning registration pins.

It is a further object of the invention to provide a resilient media support which includes one or more registration pins which are removably mounted within slide tracks or slideways formed in the support.

It is a further object of the invention to provide registration pin assemblies which include a slide mounted support base wherein a spring mounted registration pin is contained.

Various of the foregoing objects, advantages and distinctions of the invention are found in presently preferred constructions which are described below with respect to the appended drawings. These constructions provide at least one slide track which is mounted along a channel formed within a resilient media and/or artwork support, such as a foam covered board or a vacuum mat. In an inflatable vacuum mat, each track is supported to a membrane which is in communication with an interior vacuum space.

One or more registration pin assemblies are removably and slidably mounted along each track. Each pin assembly comprises an annular support base which cooperates with the slide track and an open end which receives a registration pin secured within a spring biased retainer. Pins of various profiles may thereby be mounted within different ones of the support bases and at desired spacings along the track.

In another construction, individual pin containing retainers are mounted in slots formed in foam covered board which mounts between an air bladder and a pin location template.

Still other objects, advantages and distinctions of the invention will become more apparent upon reference to the following description with respect to the appended drawings. Although the invention is described with respect to presently preferred constructions, various considered improvements and modifications are described as appropriate. The description should therefore not be interpreted in strict limitation of the disclosed invention, which instead should be interpreted broadly in view of the following appended claims.

BRIEF DESCRIPTION OF THE DRAWINGS

FIG. 2.

DESCRIPTION OF THE PREFERRED EMBODIMENT

Figure 1:
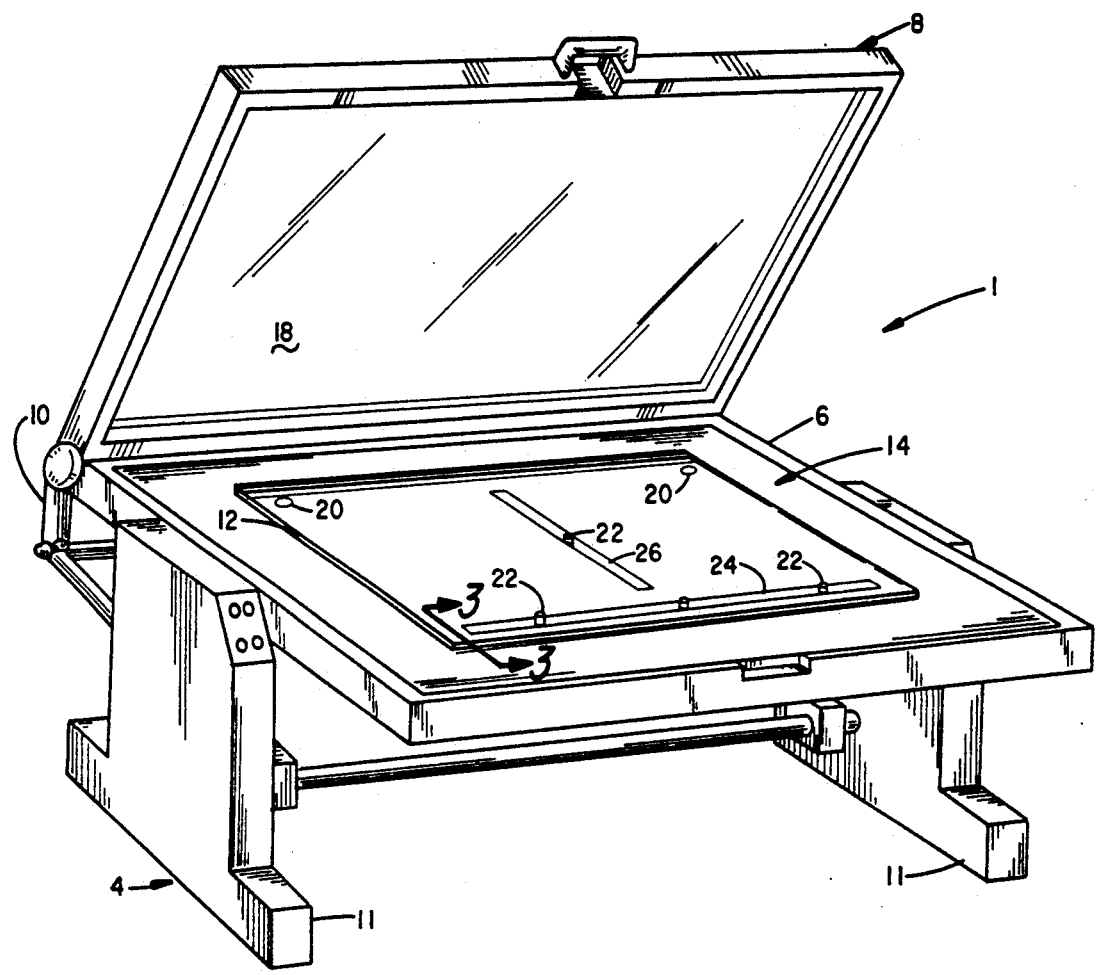
FIG. 1 is a perspective drawing of a vacuum frame assembly having a removeable media support which provides channels for a pair of registration pin containing slide tracks of the present invention.
Figure 2:
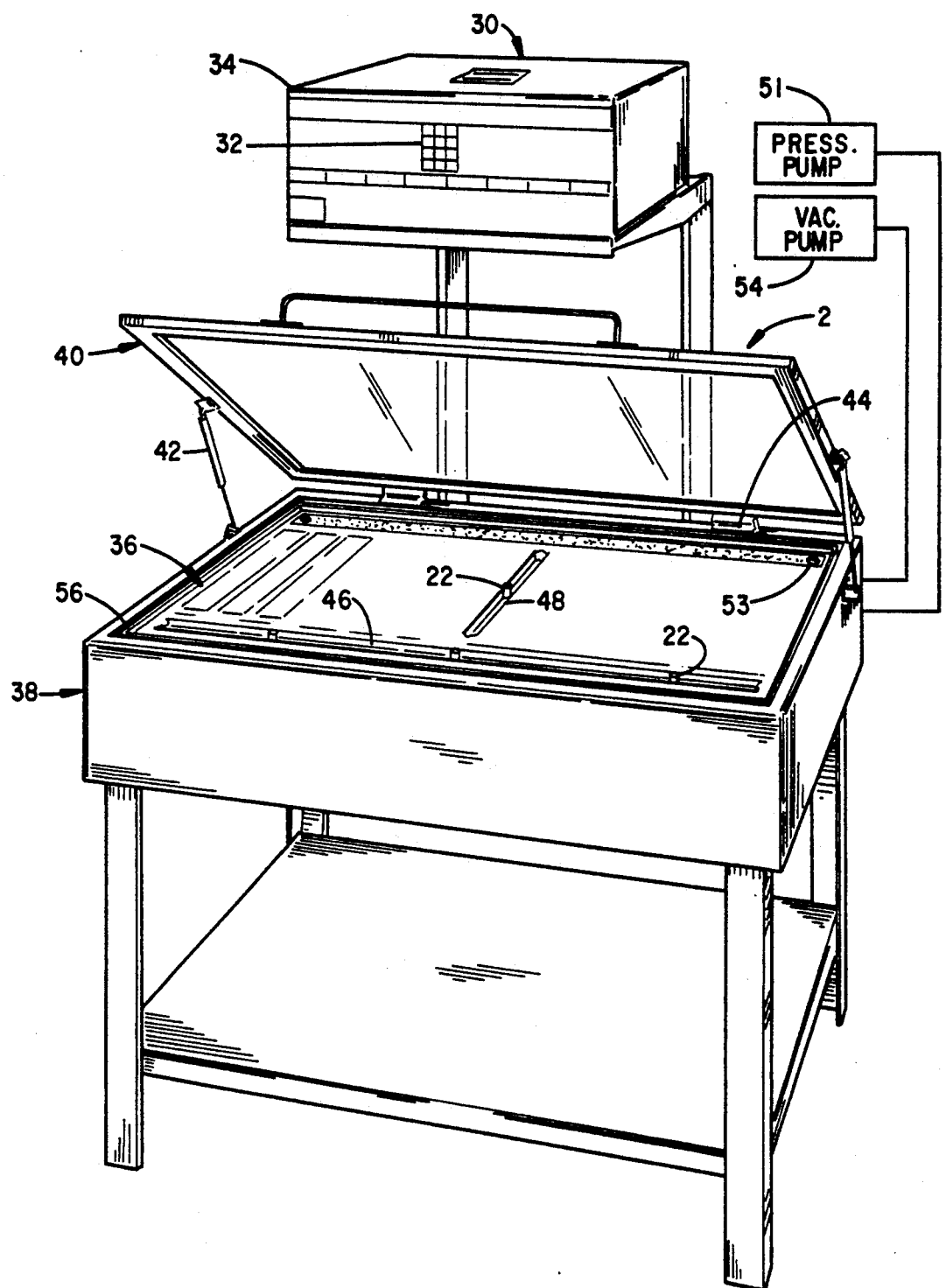
FIG. 2 is a perspective drawing of another vacuum frame which includes an inflatable vacuum mat that contains channels wherein the slide tracks are mounted.

Referring to FIGS. 1 and 2, perspective drawings are shown of alternative vacuum frame assemblies 1 and 2 which have been modified to include the improvement of the present invention. The assembly of FIG. 1 provides a support stand 4 which includes a table 6 and along one edge of which a transparent cover 8 is hinge mounted. A cantilever support assembly 10 provides a number of frame members which extend between the cover 8 and legs 11 to stabilize the hinging of the relatively large cover 8.

Upon closing the cover 8, a peripheral seal or bead 12 of a mat 14 mounted on the table 6 mates with the cover 8 along a lower surface of a transparent window 18. The mat 14 typically comprises a bladder 19 and to which a foam cover 21 and the bead 12 are bonded (reference FIG. 3). Alternatively, the bead 12 can be formed as an integral part of the foam cover 21.

A space is thus created between the window 18 and mat 14 which can be vacuum evacuated upon expanding the bladder 19 and/or via air ports 20 provided at the corners of the mat 14 which communicate with conduits secured elsewhere to the table 6. Upon evacuation, a template 21 (reference FIG. 11) which establishes the positions of a number of registration pins 22, the light sensitive media (not shown) and/or overlying artwork (not shown), which are normally supported on the mat 14, are drawn into intimate contact with the window 18 and the lower lying resilient mat 14.

The plurality of registration pin assemblies 22 are slidably mounted along horizontal and vertical channels or slots 24, 26 formed at a lower edge and at the center of the mat 14. Each slot contains a slide track 80. The pin assemblies 22 restrain and register the media and artwork to the framing assembly 1. More of the details of the registration pin assemblies 22 and slide track 80 will be discussed hereinafter. Otherwise, associated photo imaging equipment (not shown), is typically positioned over the framing assembly 1 and supported relative to the media to expose the media and wherefrom corresponding printing plates are formed.

FIG. 2 depicts an alternative vacuum framing assembly 2 which includes an integrated, overlying light source 30. An exposure controller assembly 32 is provided at a housing 34 of the source 30. The controller 32 regulates high intensity lamps (not shown) mounted in the housing 34.

An inflatable vacuum mat 36, is secured to a table 38, which again includes a transparent cover 40 that is pivotally supported from a pair of air cylinders 42 and hinges 44. The mat 36 includes horizontal and vertical channelways or slots 46 and 48, which again contain slide mounted media registration pin assemblies 22.

Figure 4:
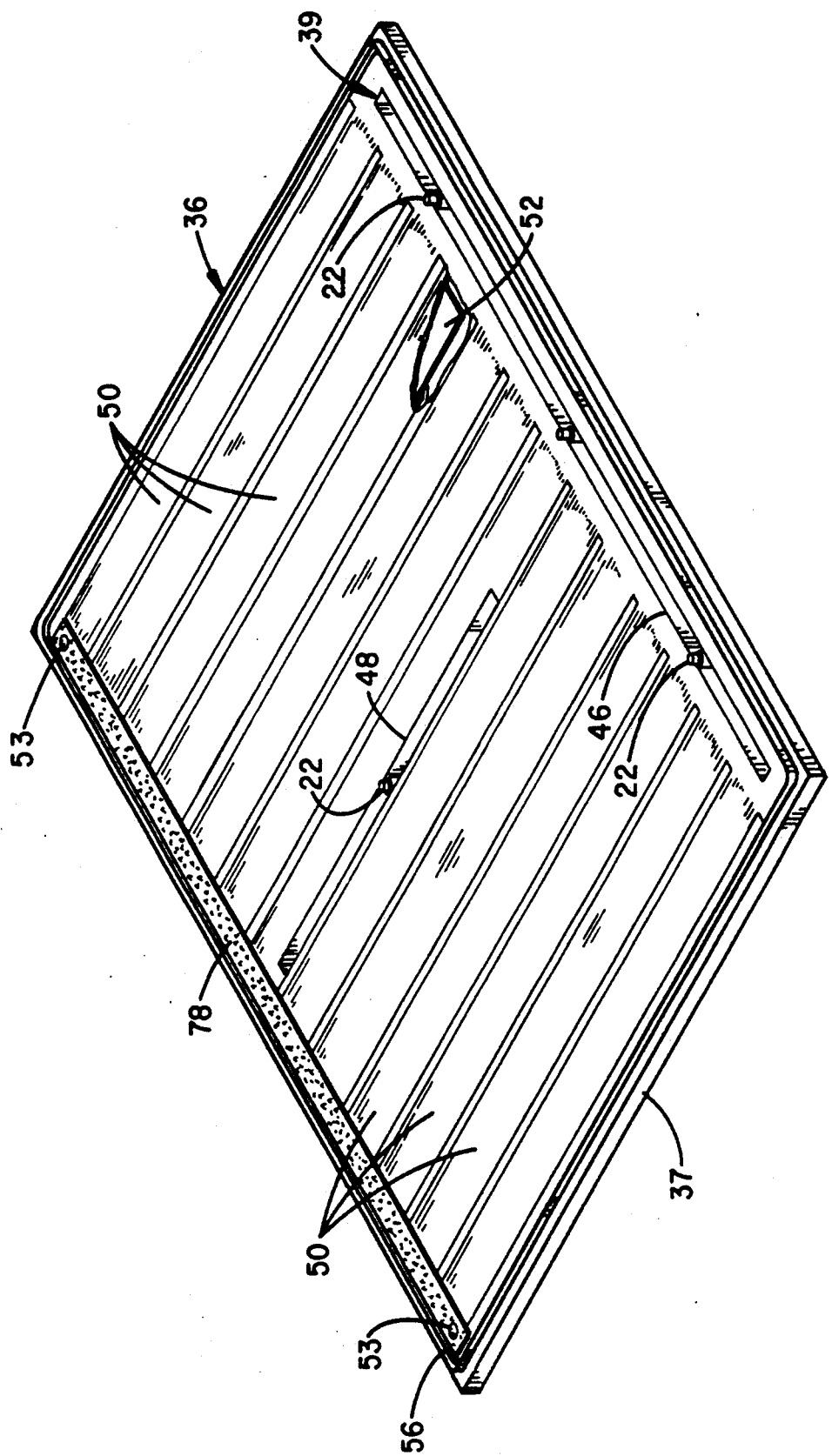
FIG. 4 is a perspective drawing of the vacuum mat of FIG. 2.
Figure 5:
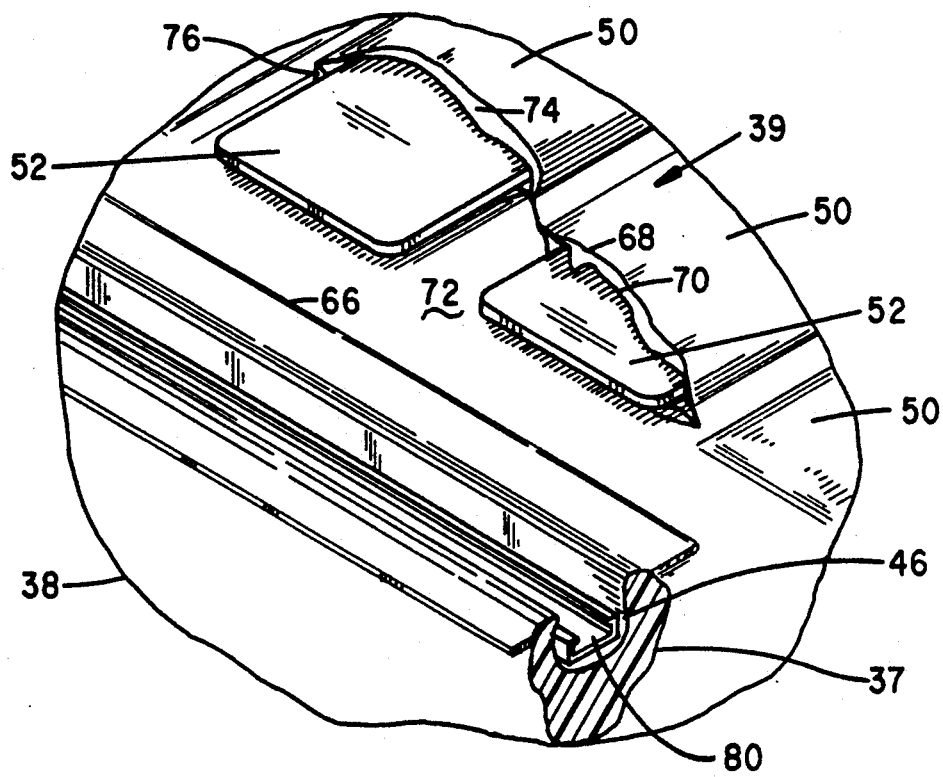
FIG. 5 is a perspective drawing of a detailed section of the mat of FIG. 2 taken along one of the slide channels and depicting the details of the vacuum mat.

With additional attention to FIGS. 4 and 5, the vacuum mat 36, provides a base foam elastomer support pad 37 and to an upper surface of which a multi-layer, polymer laminate 39 is secured. The laminate 39 includes a series of interconnected, channelway segments 50. The segments 50 can be pressurized via an air pump 51 in relation to included metal stays 52 to force air from between the media and cover 40 through corner ports 53, during a first phase of operation (reference FIG. 4).

Upon inflating the channelway segments 50 and evacuating the bulk of the air within a space defined by a peripheral bead 56, which mates with the lower surface of the cover 40, a vacuum pump 54 is engaged. A vacuum draw down cycle ensues to induce intimate contact of the pin alignment template 21 and light sensitive media (not shown) with the mat 36 and cover 40. The media is then normally exposed.

FIG. 4 particularly depicts a perspective drawing of the mat 36 removed from the vacuum framing assembly 2. FIG. 5 depicts a detailed cutaway view of a portion of the mat 36 along the lower horizontal channelway 46. The mat 36 can exhibit any desired size although typically ranges from approximately 20 to 36 inches wide by 24 to 48 inches long and is one-half to one inch thick.

Bonded to an upper surface of the foam support pad 37 is the multi-layered laminate 39 which is coupled to the associated pressurization means or air pump 51 and the vacuum means or vacuum pump 54. The pumps 51 and 54 may comprise a two-way pump. Surrounding and separately bonded to the periphery of the laminate 39 is the raised, resilient rib or bead 56. The bead 56 is formed from a soft polymer material which readily compresses and seals against the transparent cover 40 at the operating pressure/vacuum.

The plurality of channelway segments 50 are formed by selectively sealing ones of the layers of the laminate 39 to one another to form a continuous serpentine channel system that extends the length and width of the laminate 39. Although in the preferred construction the channels 50 form a continuous air path, they can be arranged to inflate in any desired order with appropriate couplings to the pumps 51, 54 and each other.

Formed into the lower horizontal edge and at the center of the mat 36 are the slots 46 and 48 and whereat the registration pin assemblies 22 are mounted. The individual pin assemblies are supported from separate slide track assemblies 64. The details of the slide tracks assemblies 64 are discussed below with respect to FIGS. 8 through 11.

Each track assembly 64 is supported in relation to the laminate 39 to effect the required vacuum sealing. At FIG. 5, a strip piece 66, which is bonded to the upper surface of the laminate 39, drapes into the slot 46. The strip 66 may also be secured to the bottom of the mat 36 or may not even be required, if the laminate is flexible enough to drape into the channels 46, 48 without bonding. A proper seal is thereby facilitated between the tracks 64, bead 56 and cover 40 during normal pressure/vacuum cycling.

FIG. 5 also shows more of the details of the laminate 39 in relation to the foam support pad 37. The laminate 39 comprises a series of layers 68, 70 and 72 of rubberized or polymer materials which overlay each other and are sealed to form upper and lower tubular channels 74 and 76 at each longitudinal channelway segment 50. A rigid metal or plastic stay 52 is mounted in each of the lower channels 76 to mechanically stabilize the membrane 39. The upper channels 74 communicate with the pump 51 via air inlet ports formed in the undersurface of the mat 36. Cross over channels which communicate with each channel 74 are provided along the front and rear edges of the mat 39. A continuous passageway is thereby provided to air admitted via the pressurization pump 51. The lower channels 76 may or may not communicate with the upper channels.

With the admission of air to the channels 74, the channelway segments 50 billow to press the media into relatively secure contact with the transparent cover 40, the air between the media and cover is forced into an end space of the mat 36 and, in particular, knurlings or projections of a knurled strip 78 which extends the width of the mat 39. The knurlings of the strip 78 project such that the compressed air is able to flow along the strip 78 to the exhaust ports 53 provided at the lateral ends. The vacuum pump 54 is coupled to the ports 53. During the subsequent pump down cycle, any air not evacuated during the compression cycle is removed from the interior space of the mat 36.

Figure 6:
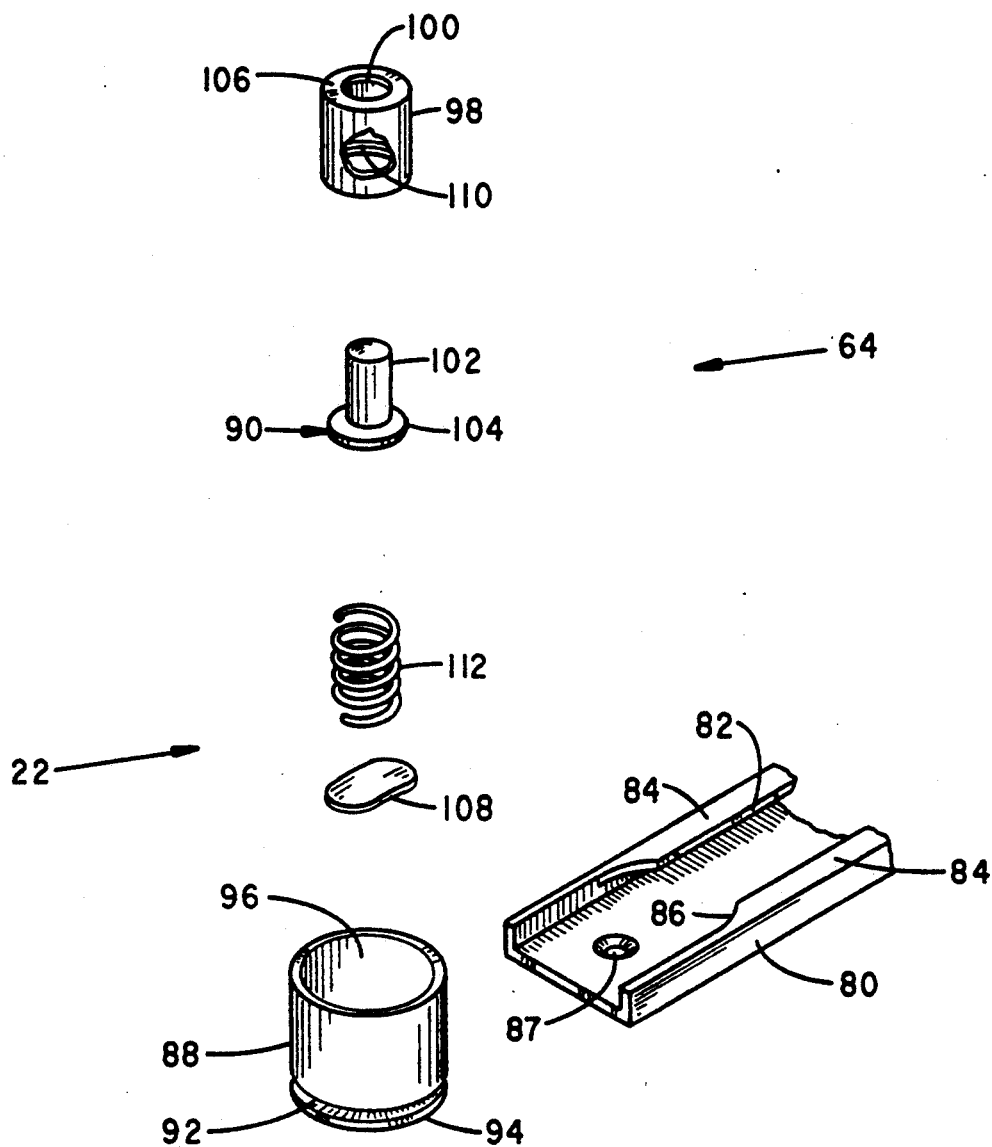
FIG. 6 is a perspective drawing shown in exploded assembly of a portion of one of the slide tracks and mating registration pins.
Figure 7:
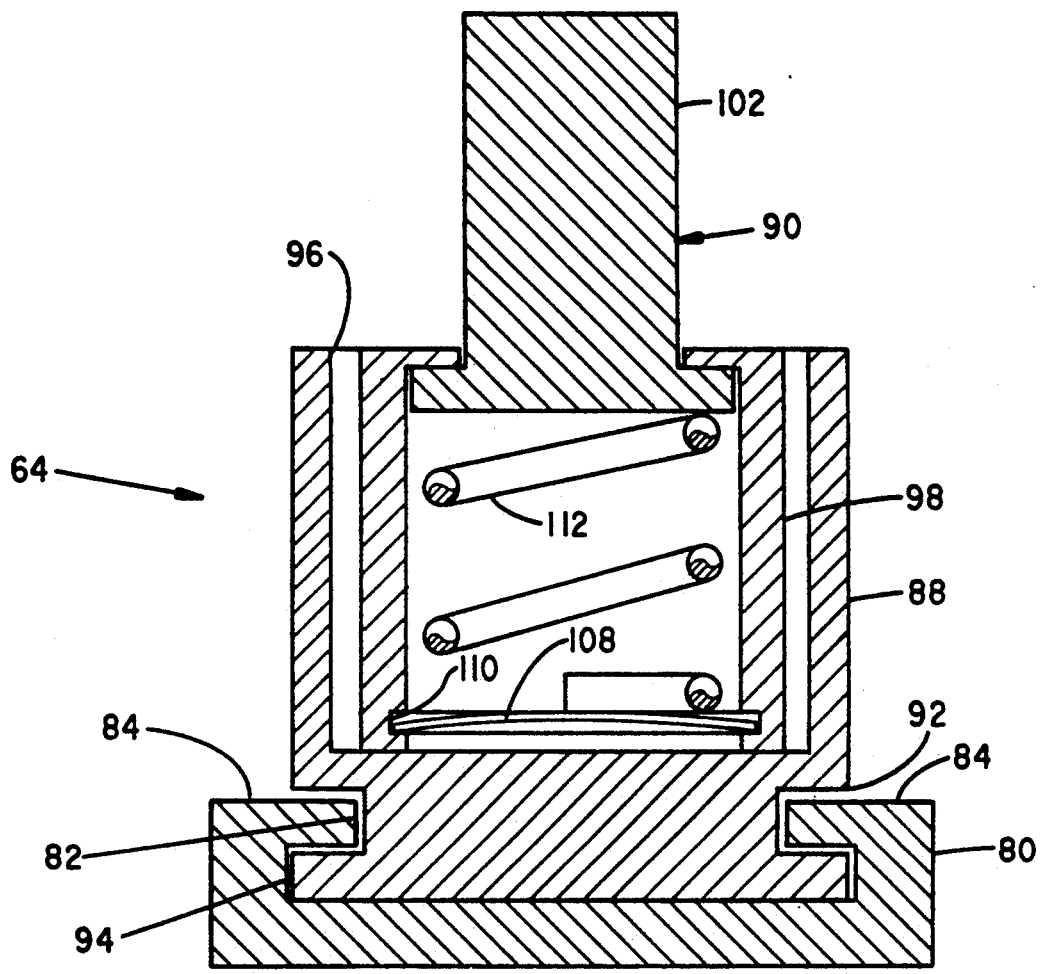
FIG. 7 is a cross section view taken through one of the registration pins.
Figure 8:
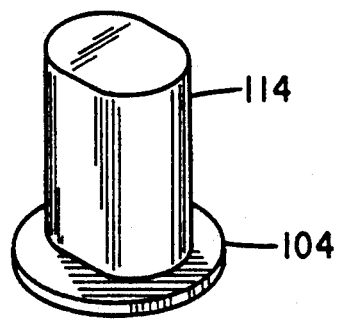
FIG. 8 is a perspective drawing of a registration pin including flattened sides.

Referring next to FIGS. 6 through 8, detailed drawings are provided of the slide track assemblies 64 and individual registration pin assemblies 22 which mount within the channels or slots 24, 26 and 46, 48 of the vacuum frame assemblies 1, 2 of FIGS. 1 and 2. With particular attention to FIG. 6, each slide track assembly 64 comprises an aluminum, end milled track piece 80 which provides a slide channel or slideway 82 between overlapping flanges 84. A cutout 86 is provided at at least one end of each track 80. The cutout 86 extends into the flanges 84 to permit a removeable mounting of one or more registration pin support base 88 to the track. The bases 88 may thereby be selectively added or removed from each track assembly 64 to accommodate a particular media registration.

Figure 3:
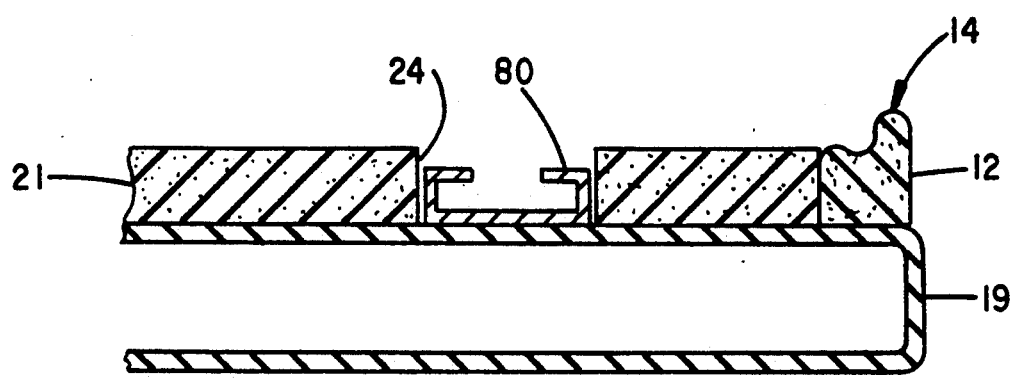
FIG. 3 is a partial section drawing of the track mounting of FIG. 1, taken along section lines 3—3.

The track pieces 80 may be permanently bonded to the tables 6 or 38 of the vacuum frame assemblies with appropriate through fasteners (not shown) at countersunk holes 87. A seal or sealing adhesive may be included between the track 80 and table. Alternatively, the tracks 80 can merely rest on a mat 39 or sealed strip 66 in the fashion of FIGS. 3 and 5, provided a vacuum tight seal is obtained.

Each registration pin assembly 22 includes one of the open-ended support bases 88. Presently a cylindrical base is preferred, although other configurations may be used, depending upon the configuration of the slots 22, 24 or 46, 48 or slideways 82. An annular groove 92 is let into each support base 88 such that the slideway flanges 84 mount within the groove 92, as a lower rim piece 94 slides along the slideway 82.

Loosely contained within an inner bore or cup region 96 of the support base 88 is a resiliently mounted registration pin assembly 90. Each pin assembly 90 comprises a tubular retainer 98 which has a central bore 100 and whereat a solid registration pin 102 is slidably mounted. Overlapping annular flanges 104 and 106 at the base of the pin 90 and the top of the retainer 98 secure the pin 102 to the retainer 98. A flexible clip 108 mounts within a groove 110 formed along an inner surface of the retainer 98 and secures the pin 102 and a spring 112 therebetween. The spring 112, in turn, biases the registration pin 102 to a fully upright position.

The outer dimensions of the retainer 98 and the inner bore 96 of the base support 88 are otherwise sized to permit a degree of lateral freedom to each registration pin 90 during the initial mounting of the template 21 and media. That is, the annular gap 113 allows each pin 90 a degree of movement so the pins 90 can self-align to mating apertures formed within the template 21 and media. Different pin assemblies 90 may thus be readily inserted or removed from the bases 88 and which may also be independently adjusted along the track pieces 80.

Although a cylindrical pin shape is shown at FIG. 6, the configuration of the pin 102 can be varied to match the specific customer template and light sensitive media. FIG. 8 discloses an alternative pin configuration wherein opposite sides of the pin 114 are flattened to provide a semi-rectangular pin profile when viewed from above.

Figure 9:
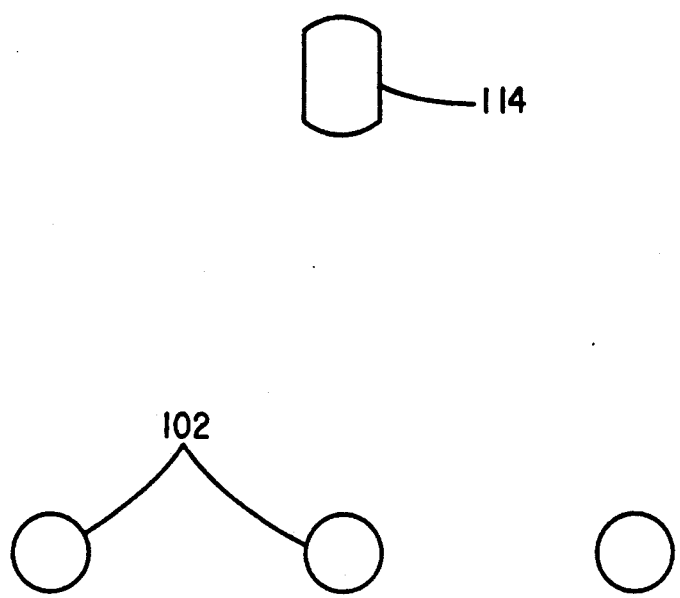
FIG. 9 depicts a top plan view of a typical arrangement of the registration pins.
Figure 10:
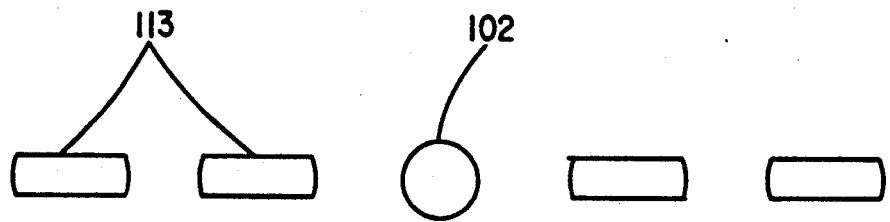
FIG. 10 is a top plan view of an alternative, horizontal arrangement of the registration pins.
Figure 11:
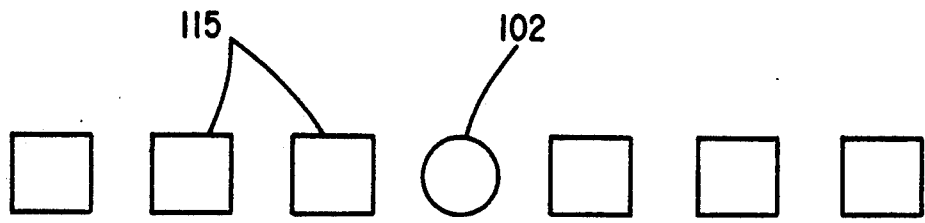
FIG. 11 is a top plan view of yet another alternative, horizontal arrangement of the registration pins.

FIG. 9 depicts typical horizontal and vertical or "line" pin mountings which may occur at the mats 14 or 36. Specifically, three cylindrical pins 102 are provided along the horizontal track and a single semi-rectangular pin 114 is provided along the vertical or line track. FIGS. 10 and 11 show alternative horizontal pin arrangements of the pins 102 with pins 113 and 115 of still other shapes, which arrangements, not necessarily the pin shapes, are commonly used with many conventional imaging systems. The pins 113 exhibit a thinner profile than the pins 102 or 114, while the pins 115 are rectangular shaped. Triangular, square, ovular or any number of other pin shapes or arrangements can be obtained as desired.

Appreciating the many varieties of pin configurations and arrangements which are required to accommodate different imaging systems, the advantages of the present slide track assemblies 64 become very apparent. That is, the present track assemblies 64 and removeable pin assemblies 22 allow the vacuum frame user to accommodate a wide array of registration pin mounting arrangements. Moreover, such arrangements are achieved in a single assembly, as opposed to the necessity of maintaining numerous imaging boards with peculiar and/or unique, permanently mounted registration pin configurations.

Figure 12:
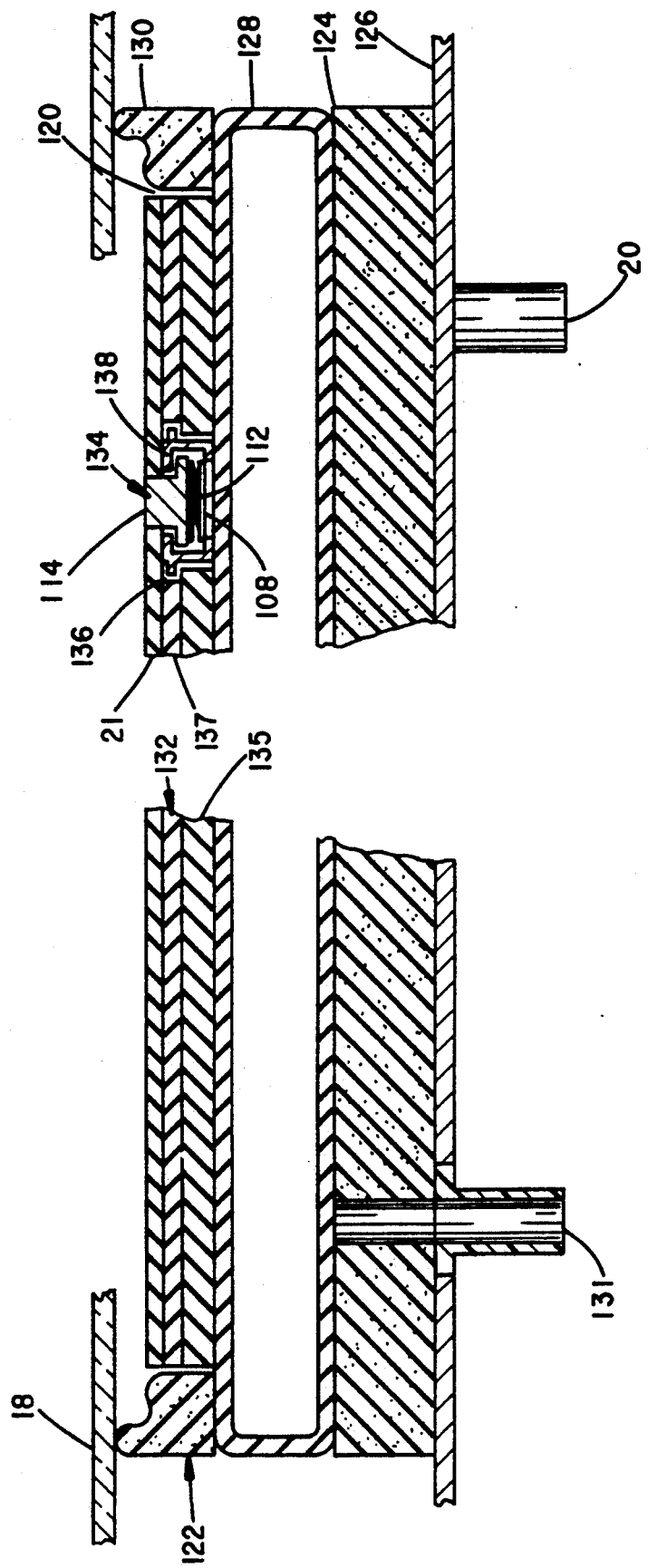
FIG. 12 is a cross section drawing of an alternative slide track construction when spring biased registration pins are removably mounted in slots formed into a foam covered registration board usable with a variety of existing imaging systems.

In the latter regard and with additional attention to FIG. 12, a cross section drawing is shown through a portion of a light exposure assembly similar to that of FIG. 1. However, instead of using a mat 14 and pin receiving channels 24, 26, such as in the system 1 of FIG. 1, an improved registration pin board 132 is provided.

Appreciating that many existing systems utilize applicant's IMAGE CONTROL BOARDS, the pin registration board 132 has been improved to include a number of removable, slide mounted registration pin assemblies 134. The board 132 typically mounts in a recess 120 defined in a bladder assembly 122. The bladder assembly 122 typically rests on a foam layer 124 supported to a sheet metal bottom 126 of an imaging system table, such as the table 6. The bladder assembly 122 comprises a hollow fabric bladder 128 and to an upper surface of which a resilient elastomer seal 130 is adhesively bonded. Air port 131 is secured to the bladder to permit inflation.

Upon closing the cover 8, the glass 18 strikes the bead 130 to depress same and create a sealed space within the cavity 120. Upon expanding the bladder assembly 122, the pin registration board 132 and contained template 21 and light sensitive media are brought into intimate contact with the glass 18. The air is separately expelled via vacuum ports (not shown).

In contrast to prior registration boards, the registration board assembly 132 includes one or more, spring biased registration pin assemblies 134. The assemblies 134 are removably and slidably mounted to the board assembly 136. That is, elongated slots 136 are let into a hard sintra layer 135 and overlying, PVC layer 137 containing a hair cell pattern and within which the pin assemblies 134 can be manipulated to and fro over the length of the provided slot 136.

Figure 13:
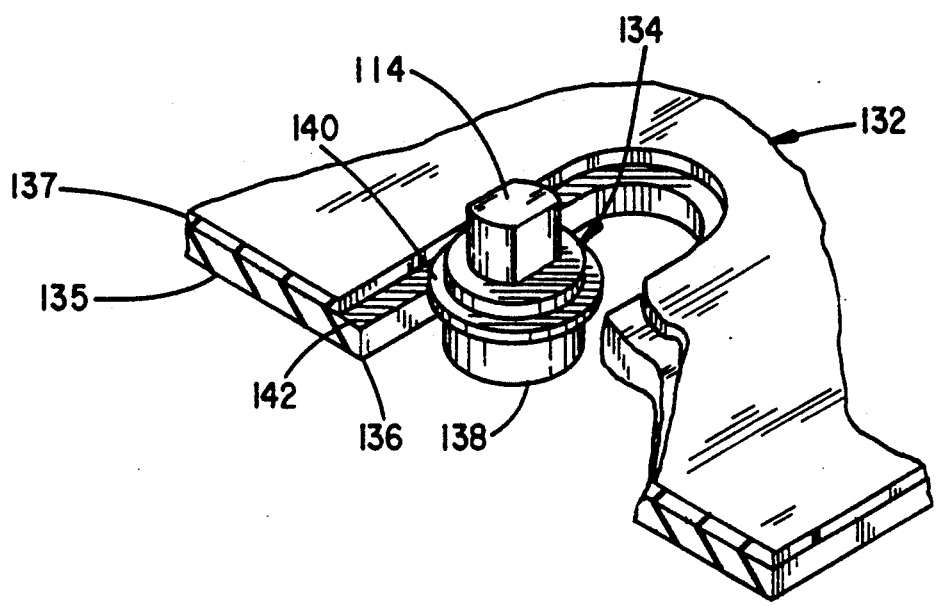
FIG. 13 is an isometric drawing of one of the slots of the registration board of FIG. 12.

With additional attention to FIG. 13, each pin assembly 134 provides a retainer 138 having an annular flange 140 which radiates from the retainer and slides on a ledge 142 formed within the slot 136. The positioning of the flange 140 along the retainer 138 is such that the entire retainer mounts within the height of the board 136, with only the pin 114 projecting above the board 136. A spring 112 and a retainer plate 108 are mounted below each pin 144 and retain the pin within the base 138. As described above, the configuration of the pin 144 can be cylindrical, semi-rectangular or of any other configuration compatible with the pin registration template 21. The template 21 particularly mounts above the registration board 132 and defines the preferred alignment of each of the pins 134, which now can be changed and/or manipulated to and fro to accommodate the template 21. A single, improved board 132 can thus replace the need for many registration boards, which separately contain a number of permanently mounted pins.

While the present invention has been described with respect to its presently preferred construction and various contemplated modifications and improvements thereto, it is to be appreciated that still other constructions may be suggested to those skilled in the art. Accordingly, the following claims should be interpreted to include all those equivalent embodiments within the spirit and scope thereof.

What is claimed is:

1. Image registration apparatus comprising:
   a) means including a table and a transparent cover which mounts to said table for imaging photosensitive media exposed through said cover;
   b) means for creating a sealed cavity between said cover and table and wherein said cavity contains the media;
   c) vacuum means for evacuating air from said cavity prior to imaging the media; and
   d) media support means for supporting said media on said table and including a resilient mat having 1) a plurality of elongated apertures and a plurality of tracks, wherein on of said plurality of tracks is mounted within each of said apertures, wherein each track defines a slideway, and wherein at least one of said tracks includes a registration pin slidably mounted along the slideway to project above said mat to mate with an aperture in the media and 2) a plurality of membrane layers having a plurality of channels defined between ones of said plurality of layers, wherein ones of the channels define airways that communicate with a means for inflating ones of a channels to engage the media with the cover and others of the channels include rigid stays.

2. Apparatus as set forth in claim 1 having a first aperture horizontally disposed along a lower edge of said mat and a second aperture longitudinally disposed at a center region of the mat.

3. Image registration apparatus for photosensitive media comprising;
   a) a resilient mat having an elongated aperture exposed through a media support surface of said mat;
   b) a track defining a slideway mounted within said aperture; and
   c) media registration means including a registration pin for mating with an aperture in media supported on said mat, wherein a base member is supported along said track and has a cavity and an open end thereto, which open end receives said registration pin, and wherein said aperture includes a region where the open end is exposed through the media support surface such that said registration pin may be inserted or removed from said track and through the media support surface without disturbing said mat.

4. Apparatus as set forth in claim 3 wherein said base support comprises a member having an open end, a bottom and an annular groove in an outer surface, which groove mates with said first and second flanges, and wherein said registration pin mounts within said open end.

5. Image registration apparatus for photosensitive media comprising:
   a) a mat including a plurality of layers, wherein each of a plurality of said layers includes an elongated aperture and which apertures align to define a slideway which is exposed through a media support surface of said mat; and
   b) media registration means mounted within said slideway and including a registration pin which projects above said mat for mating with an aperture in media supported on said mat, wherein said aperture includes a region where said registration pin is exposed through the media support surface such that the registration pin may be inserted or removed from said slideway without disturbing said mat.

6. Apparatus as set forth in claim 5 wherein said registration pin means includes a base support having radially extending flanged surfaces, which flanged surfaces engage said ones of said plurality of layers and means for spring biasing the registration pin to said base support.

7. Image registration apparatus comprising:
   a) means including a table and a transparent cover which mounts to said table for imaging photosensitive media exposed through said cover;
   b) means for creating a sealed cavity between said cover and table and wherein said cavity contains the media;
   c) vacuum means for evacuating air from said cavity; and
   d) media support means for supporting said media on said table and including 1) a resilient mat having an elongated aperture, which is exposed through a surface that supports the media, and a track mounted within said aperture, wherein said track includes a slideway and a registration pin mounted to the slideway to project above said mat and mate with the media and 2) inflatable means for inflating and engaging the media with the cover prior to engaging the vacuum means.

8. Apparatus as set forth in claim 7 wherein said aperture includes a region where the track is exposed through the media support surface to permit the mounting or removal of the registration pin from the track at said region through said aperture without disturbing the media.

9. Apparatus as set forth in claim 7 wherein said track includes first and second flanges which flanges extend to define the slideway and which flanges mount within a groove let into a base support of said registration pin.

10. Apparatus as set forth in claim 9 wherein the first and second flanges include a region which is formed such that the base support may be inserted or removed from the track at said slideway region and which slideway region is exposed at a region of said aperture through the media support surface, whereby the base support may be inserted or removed from said slideway without disturbing said mat from said table.

11. Apparatus as set forth in claim 9 wherein said base support comprises a member having an open end, a bottom and an annular groove in an outer surface, which groove mates with said first and second flanges, and wherein said registration pin mounts within said open end.

12. Apparatus as set forth in claim 11 wherein the registration pin mounts within a pin retainer and wherein the registration pin is spring biased to extend from the pin retainer.

13. Apparatus as set forth in claim 9 wherein said base support includes an open end, wherein a pin retainer, which supports the registration pin and a spring, mounts within the open end, and wherein said aperture includes a region where the open end is exposed through the media support surface such that the pin retainer may be inserted or removed from the mat without disturbing said mat from said table.

14. Apparatus as set forth in claim 13 wherein the open end of said base support permits lateral movement of said pin retainer within said base support and the removal of the pin retainer therefrom.

15. Apparatus as set forth in claim 7 wherein said mat includes a resilient projection which circumscribes the periphery of said mat and compresses upon contact with said cover to define said cavity.

16. Apparatus as set forth in claim 7 wherein the media support means includes a multi-layered membrane secured to said mat and having a plurality of channels defined between ones of a plurality of layers, wherein ones of the channels define airways that communicate with an air pump means and others of the channels include rigid stays.

17. Apparatus as set forth in claim 7 wherein said mat includes an exhaust port which is coupled to said vacuum means.

* * * * *